United States Patent
Wang et al.

(10) Patent No.: US 9,817,063 B2
(45) Date of Patent: Nov. 14, 2017

(54) INTERCONNECT RELIABILITY STRUCTURES

(71) Applicant: GLOBALFOUNDRIES INC., Grand Cayman (KY)

(72) Inventors: Ping-Chuan Wang, Hopewell Junction, NY (US); Andrew T. Kim, Poughkeepsie, NY (US); Ronald G. Filippi, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 9 days.

(21) Appl. No.: 15/048,704

(22) Filed: Feb. 19, 2016

(65) Prior Publication Data
US 2017/0242067 A1   Aug. 24, 2017

(51) Int. Cl.
*G01R 31/28* (2006.01)
*H01L 21/66* (2006.01)
*H01L 23/522* (2006.01)
*H01L 27/08* (2006.01)

(52) U.S. Cl.
CPC .......... *G01R 31/2858* (2013.01); *H01L 22/34* (2013.01); *H01L 23/5226* (2013.01); *H01L 27/0802* (2013.01)

(58) Field of Classification Search
CPC . G01R 31/2858; H01L 22/34; H01L 23/5226; H01L 27/0802
USPC .................................................. 324/762.01
See application file for complete search history.

(56) References Cited

U.S. PATENT DOCUMENTS

| | | | | |
|---|---|---|---|---|
| 4,726,232 A | * | 2/1988 | Koneval | G01L 9/0054 338/3 |
| 5,057,441 A | | 10/1991 | Gutt et al. | |
| 7,009,268 B2 | * | 3/2006 | Yang | G01R 17/105 257/467 |
| 8,482,131 B2 | * | 7/2013 | Ireland | H01L 23/5226 257/773 |
| 8,754,655 B2 | | 6/2014 | Brochu, Jr. et al. | |
| 2002/0017906 A1 | | 2/2002 | Ho et al. | |
| 2004/0124537 A1 | * | 7/2004 | Takayama | H01L 23/5226 257/758 |
| 2008/0297188 A1 | | 12/2008 | Aubel et al. | |

(Continued)

FOREIGN PATENT DOCUMENTS

CN   101295002   10/2008

OTHER PUBLICATIONS

Jeong et al., "Early Failure of Short-Lead Metal Line and Its EM Characterization with Wheatstone Bridge Test Structure in Advanced Cu/ULK BEOL Process", Interconnect Technology Conference (IITC), 2013 IEEE International, 2013; 3 Pages.

(Continued)

*Primary Examiner* — Melissa Koval
*Assistant Examiner* — Rahul Maini
(74) *Attorney, Agent, or Firm* — Michael Le Strange; Andrew M. Calderon; Roberts Mlotkowski Safran Cole & Calderon, P.C.

(57) ABSTRACT

The present disclosure relates to semiconductor structures and, more particularly, to interconnect reliability structures and methods of manufacture. The structure includes: a plurality of resistors; and a voltmeter configured to sense a relative difference in resistance of the plurality of resistors indicative of at least one of a via-depletion and line-depletion.

20 Claims, 2 Drawing Sheets

(56) References Cited

U.S. PATENT DOCUMENTS

2009/0013290 A1   1/2009  Keinert et al.
2012/0062268 A1   3/2012  Chevallier et al.

OTHER PUBLICATIONS

Hauschildt et al., "Electromigration Early Failure Void Nucleation and Growth Phenomena in Cu and Cu(Mn) Interconnects", Reliability Physics Symposium (IRPS), 2013 IEEE International, 2013, pp. 2C.1.1-2C.1.6.
Chang et al., "Observation of Joule Heating-Assisted Electromigration Failure Mechanisms for Dual Damascene Cu/SiO2 Interconnects", Physical and Failure Analysis of Integrated Circuits (IPFA 2013), 2003; 5 Pages.

* cited by examiner

INTERCONNECT RELIABILITY STRUCTURES

FIELD OF THE INVENTION

The present disclosure relates to semiconductor structures and, more particularly, to interconnect reliability structures and methods of manufacture.

BACKGROUND

Interconnect yield/reliability screening is necessary for fast turnaround time in process development and qualification. These interconnect yield/reliability screenings can be used for detecting pre-existing voiding, via bottom defects, metal fill issues, etc.

Voiding can be the result of electromigration effects, e.g., via depletion and line depletion. For example, electromigration is the transport of material caused by the gradual movement of the ions in a conductor due to the momentum transfer between conducting electrons and diffusing metal atoms. The effect is important in applications where high direct current densities are used, such as in microelectronics and related structures. As the structure size in electronics such as integrated circuits (ICs) decreases, the practical significance of this effect increases to the point of device failure.

However, current interconnect yield/reliability screening cannot detect weakness or marginal defects, particularly related to electromigration (EM) issues. Also, process development cycle is significantly limited by module-level long-term electromigration (EM) stresses with slow turnaround time.

SUMMARY

In an aspect of the disclosure, a structure comprises: a plurality of resistors; and a voltmeter configured to sense a relative difference in resistance of the plurality of resistors indicative of at least one of a via-depletion and line-depletion.

In an aspect of the disclosure, a structure comprises: a first set of resistors having a first polarity; a second set of resistors having a second polarity; and a voltmeter configured to sense a relative difference in resistance between the first set of resistors and the second sets of resistors.

In an aspect of the disclosure, a method comprises: continuously monitoring a voltage $V_{WB}$ during in-line current ramp; and determining a statistically significant direction of $V_{WB}$ shift in real time during the current ramp.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to interconnect reliability structures and methods of manufacture. More specifically, the present disclosure relates to Wheatstone bridge structures which provide increased sensitivity for detection of electromigration (EM) issues. Advantageously, by implementing the structures of the present disclosure, it is now possible to provide early detection of electromigration (EM) failures in wiring structures, e.g., wiring and via interconnect structures.

In embodiments, the interconnect reliability structures can be used to determine relative electromigration (EM) reliability performance between via-depletion and line-depletion issues. In fact, by implementing the structures of the present disclosure, it is now possible to provide fast in-line test structures and methodologies to determine interconnect weakness for both via depletion and line depletion issues. To accomplish the advantages herein, the circuit structure, e.g., Wheatstone bridge structure, comprises resistors of different polarity. More specifically, the circuit structure comprises a first set of resistors having a first polarity and a second set of resistors having a second polarity. The resistors with the first polarity can be line depletion electromigration (EM) structures; whereas, the resistors with the second polarity can be via depletion electromigration (EM) structures.

The interconnect reliability structures of the present disclosure can be manufactured in a number of ways using a number of different tools. In general, though, the methodologies and tools are used to form structures with dimensions in the micrometer and nanometer scale. The methodologies, i.e., technologies, employed to manufacture the interconnect reliability structures of the present disclosure have been adopted from integrated circuit (IC) technology. For example, the structures are built on wafers and are realized in films of material patterned by photolithographic processes on the top of a wafer. In particular, the fabrication of the interconnect reliability structures uses three basic building blocks: (i) deposition of thin films of material on a substrate, (ii) applying a patterned mask on top of the films by photolithographic imaging, and (iii) etching the films selectively to the mask.

Figure 1:
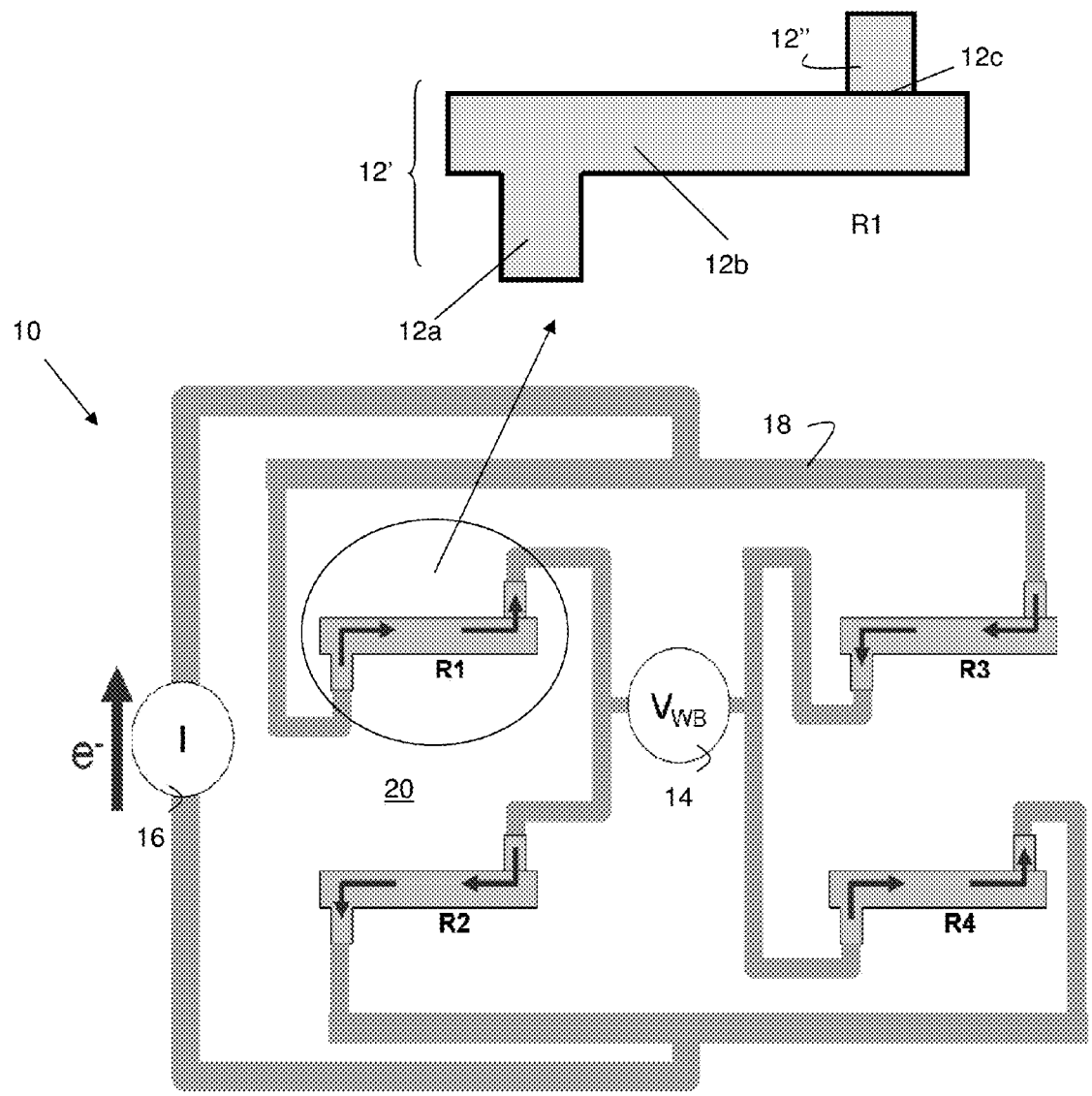
FIG. 1 shows an interconnect reliability structure and respective fabrication processes in accordance with aspects of the present disclosure.

FIG. 1 shows an interconnect reliability structure in accordance with aspects of the present disclosure. In particular, the interconnect reliability structure 10 shown in FIG. 1 is a Wheatstone bridge comprising four resistors R1, R2, R3 and R4 connected to a voltmeter 14 and each receiving a current (e⁻) originating at current source 16. As should be understood by one of skill in the art, the Wheatstone bridge 10 is an electrical circuit used to measure an unknown electrical resistance by balancing two legs of a bridge circuit, one leg of which includes the unknown component. The Wheatstone bridge 10 also has the ability to provide extremely accurate measurements. In this case, the Wheatstone bridge 10 can be used to sense a relative difference in resistance between the resistors R1, R2, R3 and R4, which may be indicative of a voiding issue.

As shown further in FIG. 1, the four resistors R1, R2, R3 and R4 are connected to the voltmeter 14 and current source 16 through wiring structures 18 formed in interlevel dielectric material generally shown at reference numeral 20. In embodiments, the wiring structures 18 will have wider line widths than each of the four resistors R1, R2, R3 and R4. For example, in embodiments, the wiring structures 18 can have line widths of about 2× or greater than the widths of the resistors R1, R2, R3 and R4. This ratio will ensure that electromigration fails will not occur within the wiring structures 18. In embodiments, the resistors R1 and R4 can be used to sense via depletion electromigration (EM) issues;

whereas, resistors R2 and R3 can be used to sense line depletion electromigration (EM) issues as discussed in more detail herein.

In embodiments, the four resistors R1, R2, R3 and R4 and wiring structures 18 can be formed using conventional CMOS processes, e.g., lithography, etching and deposition of materials. For example, each of the four resistors R1, R2, R3 and R4 comprise a dual damascene structure 12' and an interconnect wiring structure 12" formed using conventional CMOS processes. As should be understood by those of skill in the art, the dual damascene structure 12' includes an interconnect via structure 12a and a wiring structure 12b provided on adjacent wiring layers.

By way of more specific non-limiting illustrative example, to form the dual damascene structure 12', a resist is formed on a surface of interlevel dielectric material, e.g., oxide, and exposed to energy (e.g., light) to form an opening (pattern). An etching process (e.g., reactive ion etching (RIE)) is performed through the opening of the resist to form a via in an underlying interlevel dielectric material. The resist can then be exposed to additional energy (e.g., light) to form a larger opening, which is used to etch a trench into the interlevel dielectric material in alignment and communication with and above the via. After removal of the resist, e.g., by an ashing process, the sidewalls of the via and trench are lined with liner material, e.g., TiN, followed by a deposition of fill material. In embodiments, the fill material can be, e.g., copper, copper alloy, tungsten, etc., deposited using conventional chemical vapor deposition (CVD) processes. The deposition of the fill material will form the interconnect via structure 12a and wiring structure 12b. Any residual material formed on a surface of the interlevel dielectric material can be removed by a chemical mechanical polishing (CMP) process.

As should be understood by those of skill in the art, the dual damascene structure 12' will not have liner material between the interconnect via structure 12a and wiring structure 12b. Accordingly, as there is no lining material between the interconnect via structure 12a and wiring structure 12b, electrons moving in the direction from the dual damascene structure 12' to the second interconnect via structure 12" can create a void formation in the interconnect via structure 12a. And, due to these voids formations, the resistors R1 and R4, each with current flowing from the dual damascene structure 12' to the second interconnect via structure 12", can be used to sense via depletion electromigration (EM) issues by a change in their relative resistance to resistors R2 and R3.

The second interconnect via structure 12" can be formed above and in electrical contact with the wiring structure 12b using a similar process as described above, after a deposition of additional interlevel dielectric material. In embodiments, unlike the dual damascene structure 12', a liner material 12c is formed between the wiring structure 12b and the second interconnect via structure 12". This liner 12c will prevent void formation in the via interconnect. However, in embodiments, resistors R2 and R3, each with current flowing from the second interconnect via structure 12" to the dual damascene structure 12' that may create a void formation in the wiring structure 12b near or below the second via interconnect structure 12", can be used to sense line depletion electromigration (EM) issues by a change in their relative resistance to resistors R1 and R4.

In operation, a relative resistance can be sensed between the resistors R1, R2, R3 and R4. This relative resistance can be used to determine line and via depletion electromigration (EM) issues. For example, at the start of operation the resistors R1, R2 and resistors R3 and R4 will be balanced (e.g., $V_{WB}=0$). However, as voids form, the resistances of the resistors R1, R2, R3 and R4 will change relative to one another. So, for example, as the current I is increased (ramped), resistance between the two legs can become off balance, e.g., $V_{WB} \neq 0$, which would be indicative of a void formation. Thus, although a specific resistance of each the resistors R1, R2, R3 and R4 may not be known, a relative resistance amongst the resistors R1, R2, R3 and R4 can be used to determine line and via depletion electromigration (EM) issues.

More specifically, when a void forms in the wiring structure 12b (below the second interconnect via structure 12"), the resistance of the resistors R2 and/or R3 will increase; whereas, when a void forms at the interconnect via structure 12a, the resistance of the resistors R1 and/or R4 will increase. An increase in the resistance of R1 or R4 will result in a negative $V_{WB}$ ($-V_{WB}$) indicative of a via depletion failure at R1 and/or R4; whereas, an increase in the resistance of R2 or R3 will result in a positive $V_{WB}$ ($+V_{WB}$) indicative of a line depletion failure at R2 and/or R3. Thus, by sensing the relative resistances, e.g., $\Delta V_{WB}$, it is now possible to determine whether there is a via depletion issue or a line depletion issues.

Figure 2A:
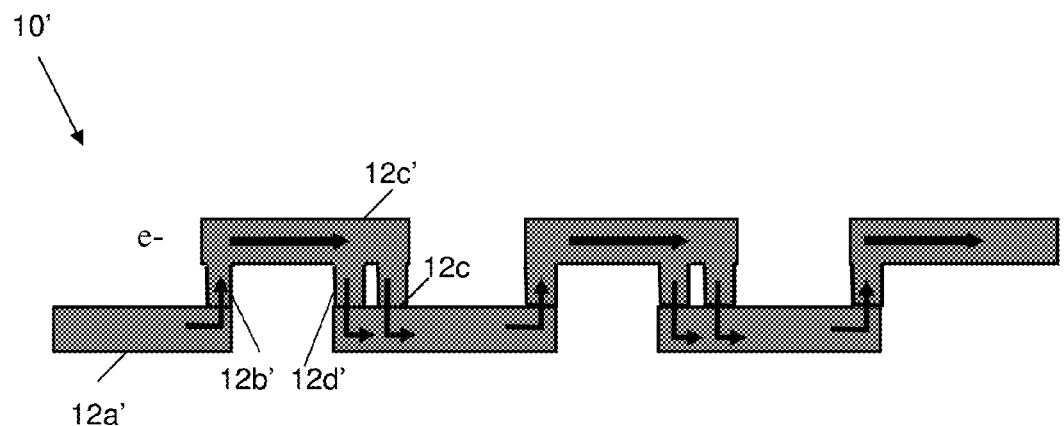
FIGS. 2A and 2B show interconnect reliability structures and respective fabrication processes in accordance with additional aspects of the present disclosure.
Figure 2B:
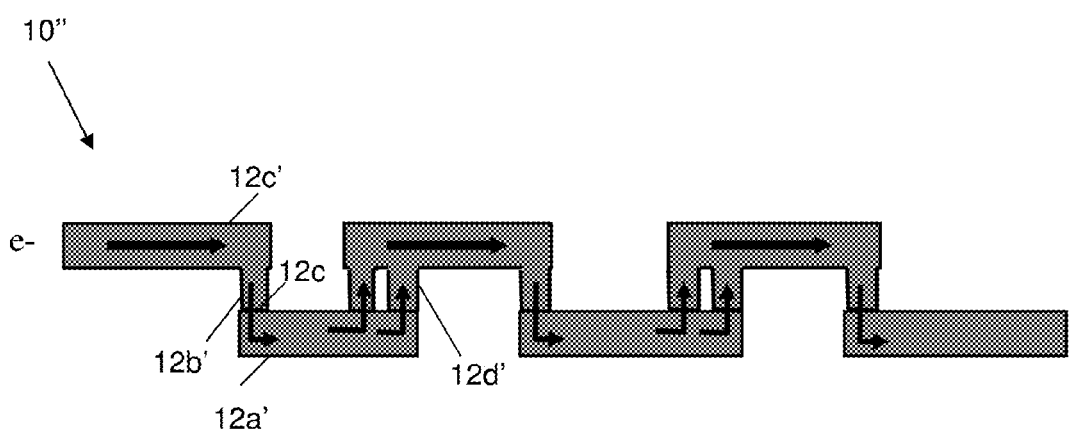

FIGS. 2A and 2B show interconnect reliability structures in accordance with additional aspects of the present disclosure. In particular, FIG. 2A shows an interconnect reliability structure 10' comprising a via chain used as resistors R1 and R4 in the Wheatstone bridge of FIG. 1, and FIG. 2B shows an interconnect reliability structure 10" comprising a via chain used as resistors R2 and R3 in the Wheatstone bridge of FIG. 1. Although FIGS. 2A and 2B show a five (5) via chain, it should be understood by those of skill in the art that any amount of via chains can be implemented in accordance with aspects of the present disclosure.

In FIGS. 2A and 2B, the interconnect reliability structures 10', 10", respectively, include a via chain comprising a lower wiring layer 12a', a via interconnect 12b', an upper wiring layer 12c' and a multitude of via interconnects 12d'. In embodiments, the lower wiring layer 12a', via interconnect 12b', and multitude of via interconnects 12d' can be formed using dual damascene processes, which is devoid of a liner at their junction; whereas, a liner 12c is provided at the juncture of the lower wiring layer 12a' and both the via interconnect 12b' and multitude of via interconnects 12d'.

Still referring to FIGS. 2A and 2B, the multitude of via interconnects 12d' are in direct electrical connection between the lower wiring layer 12a' and the upper wiring layer 12c'. The multitude of via interconnects 12d' provide a smaller resistance, e.g., less resistive path, than the via interconnect 12b'. In this way, in FIGS. 2A and 2B, due to the smaller resistive path and less current in each via interconnect within the multitude of via interconnects 12d', void formation near the multitude of via interconnects 12d' can be avoided. On the other hand, due to the larger resistive path and more current in the via interconnect 12b', void formation will occur at or near the via interconnect 12b'. In this way, in FIG. 2A, with the combination of the directional flow of electrons and the existence of liner material at the juncture of lower wiring layer 12a' and via interconnect 12b', the interconnect reliability structure 10' can sense electromigration failure due to via depletion electromigration issues. On the other hand, in FIG. 2B, with the combination of the directional flow of electrons and the existence of liner material at the juncture of lower wiring layer 12a' and via interconnect 12b', the interconnect reliability structure 10" can sense electromigration failure due to line depletion electromigration issues.

the directional flow of electrons and the lack of liner material at the juncture of the lower wiring layer 12a' and via interconnect 12b', will allow the interconnect reliability structures 10' to sense electromigration failure due to via-depletion electromigration issues. On the other hand, in FIG. 2B, due to the location of the liner 12c and directional flow of electrons, the interconnect reliability structure 10" can be used to sense line-depletion electromigration issues.

In embodiments, the voltage $V_{WB}$ will be continuously monitored during in-line current ramp. The processes herein will determine statistically significant direction of $V_{WB}$ shift in real time during the current ramp. In accordance with aspects of the invention, there will be no statistically significant shift direction in $V_{WB}$ when no defects are found. On the other hand, there will be a statistically significant shift direction in $V_{WB}$ when defects are found. An increase or decrease of shift direction in $V_{WB}$ will depend on via defects or line defects as already described herein.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a plurality of resistors; and
   a voltmeter configured to sense a relative difference in resistance of the plurality of resistors indicative of at least one of a via-depletion and line-depletion,
   wherein each of the plurality of resistors comprise via chain structures which comprise:
      a single via interconnect on one side of a wiring layer of a dual damascene structure, and
      a plurality of via interconnects on another side of the wiring layer, and
   each of the plurality of via interconnects are in direct contact with each other and an upper wiring layer.

2. The structure of claim 1, wherein the plurality of resistors comprise a first set of resistors having a first polarity and a second set of resistors having a second polarity.

3. The structure of claim 2, wherein the first set of resistors and the second set of resistors form a Wheatstone bridge.

4. The structure of claim 2, wherein the first set of resistors is configured to sense via depletion caused by electromigration and the second set of resistors is configured to sense line depletion caused by electromigration.

5. The structure of claim 4, wherein:
   the plurality of resistors each comprise the dual damascene structure and an interconnect via structure in direct electrical connection with the wiring layer of the dual damascene structure;
   a liner material between the wiring layer of the dual damascene structure and the interconnect via structure; and
   a junction of the wiring layer and a via interconnect structure of the dual damascene structure is devoid of the liner material.

6. The structure of claim 5, wherein the second set of resistors are on opposing sides of the voltmeter and are located such that electrons flow from the interconnect via structure into the dual damascene structure.

7. The structure of claim 5, wherein the first set of resistors are on opposing sides of the voltmeter and are located such that electrons flow from the dual damascene structure into the interconnect via structure.

8. The structure of claim 1, wherein the plurality of via interconnects on the other side of the wiring layer has a lower resistance than the single via interconnect.

9. The structure of claim 1, wherein the plurality of resistors are connected to a wiring structure which has a line width greater than a line width of each of the resistors.

10. The structure of claim 1, wherein the via chain structures further comprise an interconnect reliability structure.

11. The structure of claim 10, wherein a liner is provided at a junction of a lower wiring layer and the single via interconnect and at a junction of the lower wiring layer and the plurality of via interconnects.

12. A structure, comprising:
   a first set of resistors having a first polarity;
   a second set of resistors having a second polarity; and
   a voltmeter configured to sense a relative difference in resistance between the first set of resistors and the second set of resistors,
   wherein each resistor of the first set of resistors and the second set of resistors comprise via chain structures which comprise:
      a single via interconnect on one side of a wiring layer of a dual damascene structure, and
      a plurality of via interconnects on another side of the wiring layer, and
   each of the plurality of via interconnects are in direct contact with each other and an upper wiring layer.

13. The structure of claim 12, wherein the first set of resistors and the second set of resistors form a Wheatstone bridge.

14. The structure of claim 13, wherein the first set of resistors comprise a via depletion electromigration structure and the second set of resistors comprise a line depletion electromigration structure.

15. The structure of claim 14, wherein the second set of resistors are on opposing sides of the voltmeter and are located such that electrons flow from an interconnect via structure into the dual damascene structure.

16. The structure of claim 14, wherein the first set of resistors are on opposing sides of the voltmeter and are located such that electrons flow from the dual damascene structure into an interconnect via structure.

17. The structure of claim 12, wherein plurality of via interconnects on the other side of the wiring layer has a lower resistance than the single via interconnect.

18. The structure of claim 12, wherein the plurality of resistors are connected to a wiring structure which has a line width greater than a line width of each of the resistors.

19. A method, comprising:
- continuously monitoring a voltage $V_{WB}$ during in-line current ramp based on a resistive difference between a first resistor and a second resistor in a Wheatstone bridge;
- determining a statistically significant shift direction of $V_{WB}$ shift in real time during the in-line current ramp;
- an increase of the shift direction in $V_{WB}$ is indicative of a line depletion failure; and
- a decrease of the shift direction in $V_{WB}$ is indicative of a via depletion failure.

20. The method of claim 19, wherein:
- no statistically significant shift direction in $V_{WB}$ is indicative of no electromigration defects being found.

* * * * *